(12) United States Patent
Pindo

(10) Patent No.: US 6,703,170 B1
(45) Date of Patent: Mar. 9, 2004

(54) METHOD AND APPARATUS FOR REDUCING LOADING EFFECTS ON A SEMICONDUCTOR MANUFACTURING COMPONENT DURING AN ETCH PROCESS

(75) Inventor: Massimiliano Pindo, Aix-en-Provence (FR)

(73) Assignee: DuPont Photomasks, Inc., Round Rock, TX (US)

(*) Notice: Subject to any disclaimer, the term of this patent is extended or adjusted under 35 U.S.C. 154(b) by 0 days.

(21) Appl. No.: 10/023,055

(22) Filed: Dec. 13, 2001

Related U.S. Application Data
(60) Provisional application No. 60/255,785, filed on Dec. 13, 2000.

(51) Int. Cl.[7] .............................. G03F 9/00; G06F 17/50
(52) U.S. Cl. ................................ 430/5; 430/30; 716/19
(58) Field of Search ................... 430/30, 5, 313, 430/315, 320; 438/8, 5, 14, 18; 156/643, 653, 656, 657, 662; 716/19–21

(56) References Cited

U.S. PATENT DOCUMENTS
6,433,878 B1 * 8/2002 Niu et al. .................. 430/30

FOREIGN PATENT DOCUMENTS
| JP | 55-110248 | * | 8/1980 | ........... H01L/21/30 |
| JP | 56-158872 | * | 7/1981 | ............. C23F/1/00 |
| JP | 58-73804  | * | 5/1982 | ........... G01B/11/06 |
| JP | 58-126534 | * | 7/1983 | ........... H01L/21/30 |
| JP | 59-103336 | * | 6/1984 | ........... H01L/21/30 |

* cited by examiner

Primary Examiner—Kamand Cuneo
Assistant Examiner—Lisa Kilday
(74) Attorney, Agent, or Firm—Baker Botts L.L.P.

(57) ABSTRACT

A method and apparatus for reducing loading effects on a semiconductor manufacturing component during an etch process is disclosed. The transmittance associated with a photomask is calculated and the etch process for a material formed on a semiconductor manufacturing component is adjusted based on the transmittance calculated for the photomask.

22 Claims, 3 Drawing Sheets

METHOD AND APPARATUS FOR REDUCING LOADING EFFECTS ON A SEMICONDUCTOR MANUFACTURING COMPONENT DURING AN ETCH PROCESS

CROSS REFERENCE TO RELATED APPLICATION

This application claims priority from U.S. Provisional Patent Application Ser. No. 60/255,785, filed Dec. 13, 2000 by Massimiliano Pindo, and entitled "Mask Transmittance and Loading Effects in Plasma Etching with Endpoint Detection."

TECHNICAL FIELD OF THE INVENTION

This invention relates in general to semiconductor manufacturing and, more particularly, to a method and apparatus for reducing loading effects on a semiconductor manufacturing component during an etch process.

BACKGROUND OF THE INVENTION

Advances in integrated circuit (IC) design and the manufacturing techniques used to create ICs have contributed to the reduction in size of design features that form ICs. As the feature size shrinks, the number of features that may be placed in an IC increases. The features are typically formed on a semiconductor wafer by imaging patterns from a photomask into a resist layer, developing and etching the resist layer to expose the appropriate parts of a conductive layer, such as polysilicon or metal, and etching the conductive layer to form desired patterns in the conductive layer.

The etching step may be performed by a plasma etching reactor with endpoint detection. The endpoint is typically determined by a dedicated hardware and/or software system connected to the process chamber by an optical fiber. During the etch process, the material to be etched reacts with the plasma and the optical fiber collects a photo emission intensity signal of the plasma. The intensity of the signal is generally proportional to the etch rate and the process time is proportional to the total amount of material to be etched. Currently, a test wafer may be run through a semiconductor manufacturing process to determine if the endpoint of the etch process is correct. If the features on the test wafer show under or over-etch, the endpoint is adjusted and the process is repeated until an appropriate endpoint is determined for the etch process.

SUMMARY OF THE INVENTION

In accordance with the teachings of the present invention, disadvantages and problems associated with reducing loading effects on a semiconductor manufacturing component during an etch process have been substantially reduced or eliminated. In a particular embodiment, a method for reducing loading effects on a semiconductor manufacturing component during an etch process is disclosed that adjusts the etch process based on a transmittance associated with a photomask.

In accordance with one embodiment of the present invention, a method for reducing loading effects on a semiconductor manufacturing component during an etch process includes calculating a transmittance associated with a photomask and adjusting an etch process for a material formed on a semiconductor manufacturing component based on the transmittance calculated for the photomask.

In accordance with another embodiment of the present invention, a method for reducing loading effects on a semiconductor component during a plasma etch process includes determining a maximum acceptable difference between a first clear area percentage and a second clear area percentage for a plasma etch process and calculating a transmittance difference between a first transmittance for a first feature associated with a photomask and a second transmittance for a second feature associated with the photomask. The plasma etch process for a material formed on a semiconductor manufacturing component is adjusted if the transmittance difference exceeds the maximum acceptable difference for the plasma etch process.

In accordance with a further embodiment of the present invention, a method for manufacturing a photomask includes calculating a transmittance associated with a mask pattern file. A pattern from the mask pattern file is imaged into a resist layer formed on a photomask blank and the resist layer is developed to expose portions of a conductive layer disposed on a transparent substrate. An etch process for the photomask blank is adjusted based on the transmittance associated with the mask pattern file and the etch process is used to etch the conductive layer and expose portions of the transparent substrate.

Important technical advantages of certain embodiments of the present invention include the ability to characterize transmittance properties of a photomask based on a mask pattern file. A photomask is typically manufactured by exposing features from a mask pattern file, generated by a chip designer, into resist layer of a photomask blank. A photomask manufacturer may analyze the mask pattern file to determine if the features will create loading effects during an etch process. If the pattern formed by the features in the mask pattern file will cause loading effects to occur during an etch process, extra features may be added to the mask pattern file to reduce or even eliminate the loading effects.

Another important technical advantage of certain embodiments of the present invention includes the ability to accurately determine the endpoint of an etch process by calculating the transmittance associated with a photomask. Etching rates for materials typically formed on a semiconductor wafer are a function of the exposed area on a surface to be etched and the exposed area is directly related to the transmittance associated with a photomask. Due to the relationship between the transmittance and the exposed area, the etch rate of a material may be affected by the transmittance of the photomask used to image a pattern into the material. In order to reduce or eliminate loading effects during the etch process, the transmittance associated with the photomask can be used to determine the endpoint of the etch process.

All, some, or none of these technical advantages may be present in various embodiments of the present invention. Other technical advantages will be readily apparent to one skilled in the art from the following figures, descriptions, and claims.

BRIEF DESCRIPTION OF THE DRAWINGS

A more complete understanding of the present invention and advantages thereof may be acquired by referring to the following description taken in conjunction with the accompanying drawings, in which like reference numbers indicate like features, and wherein.

DETAILED DESCRIPTION OF THE INVENTION

Preferred embodiments of the present invention and their advantages are best understood by reference to FIGS. 1 through 6, where like numbers are used to indicate like and corresponding parts.

A photomask is a crucial component of a semiconductor manufacturing process because the photomask serves as a template that images a complex geometry, such as an integrated circuit (IC), on a wafer. Each IC may be formed by a combination of patterns that include multiple design features. As the dimensions of the design features decrease, the number of features that may be included in a single pattern increases and thus, the amount of material that must be etched during the semiconductor manufacturing process also increases.

In general, the etch rate of a material is a function of the respective etching process and the exposed area to be etched. For a specific etch process, the relationship between the etch rate and the exposed area, known as the loading effect, may be effected by the transmittance of an associated photomask. If the transmittance of the photomask is not used to calculate the endpoint of an etch process, the features on the wafer may be over or under-etched. By calculating the transmittance of a photomask used in a lithography process and adjusting the etch process with the calculated transmittance, possible loading effects from the etch process may be reduced or even eliminated.

Figure 1:
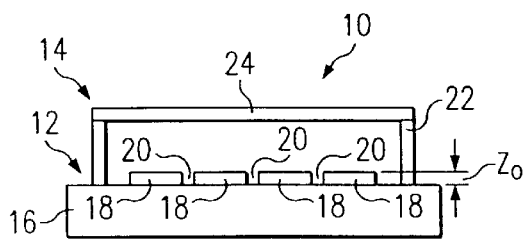
FIG. 1 illustrates a cross-sectional view of a photomask assembly that reduces loading effects during an etch process according to the teachings of the present invention.

FIG. 1 illustrates a cross-sectional view of photomask assembly 10. In the illustrated embodiment, photomask assembly 10 includes photomask 12 coupled to pellicle 14. Substrate 16, patterned layer 18 and clear areas 20 cooperate with each other to form photomask 12, otherwise known as a mask or reticle, that may have a variety of sizes and shapes, including, but not limited to, round, rectangular or square. Photomask 12 may also be any variety of photomask types, including, but not limited to, a one-time master, a five-inch reticle, or a six-inch reticle. Photomask 12 may further be a binary mask, a phase shift mask, or any other type of mask suitable for use in a lithography system. Photomask 12 includes clear areas 20 that expose a surface of substrate 16 and create a pattern on photomask 12. When photomask assembly 10 is placed in the lithography system, clear areas 20 allow electromagnetic energy from the lithography system to be projected through substrate 16 and on to the surface of a wafer. Examples of such electromagnetic energy include, but are not limited to ultra violet, deep ultra violet (DUV), extreme ultra violet (EUV) and X-rays.

For some applications, substrate 16 may be a transparent material such as quartz, synthetic quartz,. fused silica, magnesium fluoride (MgF$_2$), calcium fluoride (CaF$_2$), or any other suitable material that transmits approximately ninety-nine percent of incident light having a wavelength between approximately 120 nanometers (nm) and approximately 450 nm. Patterned layer 18 may be a metal material such as chrome, chromium nitride, a metallic oxy-carbo-nitride, where the metal is selected from the group consisting of chromium, cobalt iron, zinc, molybdenum, niobium, tantalum, titanium, tungsten, aluminum, magnesium and silicon, and any other suitable material that absorbs light with wavelengths between approximately 120 nm and approximately 450 nm. In an alternative embodiment, patterned layer 18 may be a partially transmissive material, such as molybdenum silicide (MoSi), which has a transmissivity of approximately one percent to approximately thirty percent.

Frame 22 and pellicle film 24 form pellicle 14. Pellicle film 24 may be a thin film membrane formed of a material such as nitrocellulose, cellulose acetate, an amorphous fluoropolymer, such as Teflon® AF manufactured by E. I. du Pont de Nemours and Company, or another suitable deep ultraviolet film. Pellicle film 24 may be prepared by a conventional technique such as spin casting. Frame 22 is typically formed of anodized aluminum, although it could alternatively be formed of stainless steel, plastic or other suitable materials.

Photomask 12 may be formed from a photomask blank using standard lithography processes. In a lithography process, a mask pattern file that includes data for patterned layer 18 may be generated from a circuit design pattern. The desired pattern may be imaged into a resist layer of the photomask blank using a laser, electron beam or X-ray lithography tool. In one embodiment, a laser lithography tool uses an Argon-Ion laser that emits light having a wavelength of approximately 364 nanometers (nm). In alternative embodiments, the laser lithography tool uses lasers emitting light at wavelengths from approximately 150 nm to approximately 300 nm. Photomask 12 may be fabricated by developing and etching exposed areas of the resist layer to create a pattern, etching the portions of patterned layer 18 not covered by resist, and removing the undeveloped resist to create patterned layer 18 over transparent substrate 16.

For some applications, a dry etch process, such as a plasma etch process, may be used to etch clear areas 20 into patterned layer 18 on photomask 12. The plasma etch process may also be used to etch patterns into polysilicon layers, metal layers, resist layers or any other material layers that may be formed on a semiconductor component, such as a photomask or a semiconductor wafer. In an etch reactor, the etching rate for a specific etching process depends on the exposed area (e.g., the amount of photoresist that should be removed from either a photomask blank or a semiconductor wafer, the amount of opaque material that should be removed from a photomask blank or the amount of polysilicon or metal that should be removed from a semiconductor wafer). This dependence is known as the loading effect. If the amount of exposed area is neglected when determining the endpoint of the etch process, physical variations may occur during the etch process and result in poor statistical process control (SPC) of minimum dimension features or even yield loss.

The exposed area of any material used in a semiconductor manufacturing process may be calculated by determining the transmittance associated with a photomask because the transmittance represents the total area of a material that will be exposed to radiant energy during a lithography process. For example, a lithography system typically uses a mask pattern file to image a pattern into a resist layer of a photomask blank. In one embodiment, the mask pattern file may be digitized to contain a series of ones and zeros. The ones may represent an exposed area in the resist layer of the photomask blank and the zeros may represent an unexposed area. The transmittance of the pattern being formed on the photomask blank may be calculated and used to determine if the patterns in the mask pattern file will cause loading effects to occur during an etch process either on photomask 12 or on a wafer manufactured using photomask 12. The loading effects may be eliminated by adding additional features to the mask pattern file.

In an alternative embodiment, the transmittance of photomask 12 may be calculated and used to adjust the endpoint of an etch process. In the case of "clear" field masks (e.g., used for polysilicon and metal patterns), the conductive material is left on photomask 12 where the design requires that polygons be drawn on a wafer. In the case of "dark" field masks (e.g., used for contacts and vias), the conductive material is removed from the mask where openings on the wafer are needed. In both cases, the overall glass area on the mask (e.g., clear areas 20) divided by the total exposure field (e.g., the area included under pellicle 14) is the transmittance of photomask 12, which is related to the surface area of a surface area of a wafer that will be etched.

After the pattern from photomask 12 is imaged into a resist layer formed on a photomask blank, the total transmittance associated with photomask 12 may be used to determine the etch rate and thus, the endpoint of the etch process. The etch rate (ER) of a material for a specific etch process may be calculated by:

$$ER = \frac{c_1}{1 + c_2 A}$$

where A is the total area to be etched, and $c_1$ and $c_2$ are positive constants that take into account the chemistry of the etching process, the reactive species plasma lifetimes and generation rates, and the associated reactor geometry.

The etch rate (ER), which is positive, is proportional, via a proper negative constant, to the negative variation of the volume (dV) to be etched. Since dV=Adz, where z represents the thickness of patterned layer 18, the etch rate calculation may be:

$$-\frac{A dz}{dt} = \frac{Kc_1}{1 + c_2 A}$$

The equation may be integrated by choosing the proper integration limits. At the beginning of the etch process, patterned layer 18 covers the entire surface of the photomask blank with a uniform film thickness ($z_0$). At the end of the etch process, determined by an endpoint detection time ($t_{EPD}$), z reaches a value of zero in the exposed area and remains at $z_0$ in the unexposed areas. Therefore, choosing $z_0$ and zero as integration limits on the left hand side of the above equation, and zero and $t_{EPD}$ respectively on the right hand side of the equation, the integrated equation is:

$$t_{EPD} = \frac{z_0 A (1 + c_2 A)}{Kc_1}$$

The above equation assumes that the etch velocity is uniform across the surface being etched and that there is no change, either wanted or unwanted, of the etching environment in the etch reactor.

The etch time for a particular area may then be determined by taking the derivative, which results in the following equation:

$$\frac{dt_{EPD}}{dA} = \frac{z_0}{Kc_1}(1 + 2c_2 A)$$

By definition, the totally etched area corresponds to the exposed areas of the resist layer, and thus, clear areas 20 on photomask 12. Therefore, by determining the total area to be etched, either on photomask 12 or on the wafer generated by using photomask 12, the correct endpoint may be calculated so that loading effects may be reduced or eliminated during the etch process. It should be noted that the above calculation may be repeated by taking for "A" the area of any region that is big enough to allow the integration step.

Figure 2:
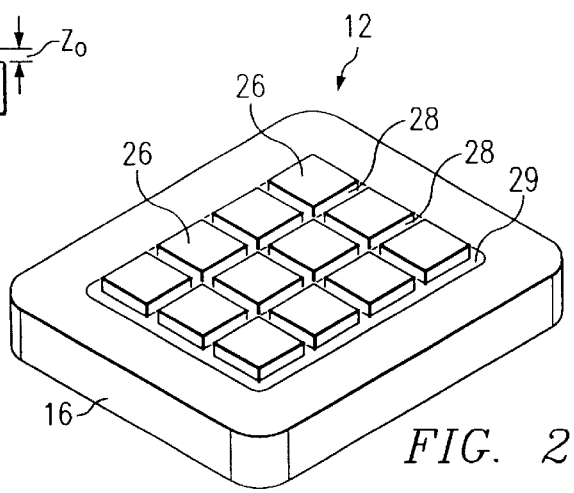
FIG. 2 illustrates a perspective view of a photomask that includes an array of die according to the teachings of the present invention.

FIG. 2 illustrates a perspective view of photomask 12 that includes an array of die 26 formed in patterned layer 18. Frame 29 surrounds the array and scribe lines 28 separate die 26. Photomask 12 may be generated by processing and composing one or more mask pattern files. For example, the mask pattern file for photomask 12 may be split into a device pattern file that includes die 26 and a frame pattern file that includes scribe lines 28 and frame 29. The patterns contained in the device and frame pattern files, excluding any ancillary patterns only used for mask fabrication and alignment during loading of photomask 12 into exposure tools, may be totaled to determine the total glass area for die 26, scribe lines 28 and frame 29.

In the illustrated embodiment, photomask 12 contains an array of die 26 that includes three columns and four rows. Each instance of die. 26 may include clear areas 20. Scribe lines 28 separate die 26 and have equal dimensions in the X and Y directions. The transmittance of photomask 12 may be defined as:

$$T = [GA_F + (M*N)GA_D]/S_F$$

where $GA_D$ is the transmittance of one instance of die 26, $GA_F$ is the transmittance of scribe lines 28 and frame 29, M is the number of columns, N is the number of rows and $S_F$ is the total area of frame 29 surrounding the array of die 26.

In one embodiment, photomask 12 may be created by imaging the patterns from the device and frame pattern files into a resist layer of a photomask blank, developing and etching the exposed areas of the resist layer, etching areas of an opaque layer not covered by the resist layer and stripping the remaining resist layer to form photomask 12. During the etch process, loading effects may occur if the etch process does not compensate for the transmittance associated with the device and frame pattern files. As described above, additional features may be added to either or both of device and frame pattern files. The additional features may create a more uniform density in the patterns located in the individual files so that the etch rate is constant over the entire surface of photomask 12. The modified mask pattern files may then be used to generate photomask 12 and reduce loading effects that can occur during the etch process.

If the photomask manufacturer is unable to alter the patterns in the device and frame pattern files, the transmittance associated with the device and frame pattern files may be used to calculate the endpoint of the etch process. For example, an etch reactor used to etch a material on photomask 12 and/or a semiconductor wafer may include hardware and/or software that monitors the reactions occurring in the etch reactor and determines the endpoint of the etch process. The etch software or logic may be embodied in any type of medium including, but not limited to, hard drives, diskettes, CD-ROMs, DVD-ROMs, optical or magnetic media, field programmable arrays (FPGAs), embedded processors, or any other suitable media. The transmittance associated with the device and frame files may be used by the etch software to calculate the correct endpoint for the etch process. Each time a new mask pattern file is used to generate a photomask, the transmittance associated with the mask pattern file may be programmed into the etch process used to generate the corresponding photomask.

Figure 3:
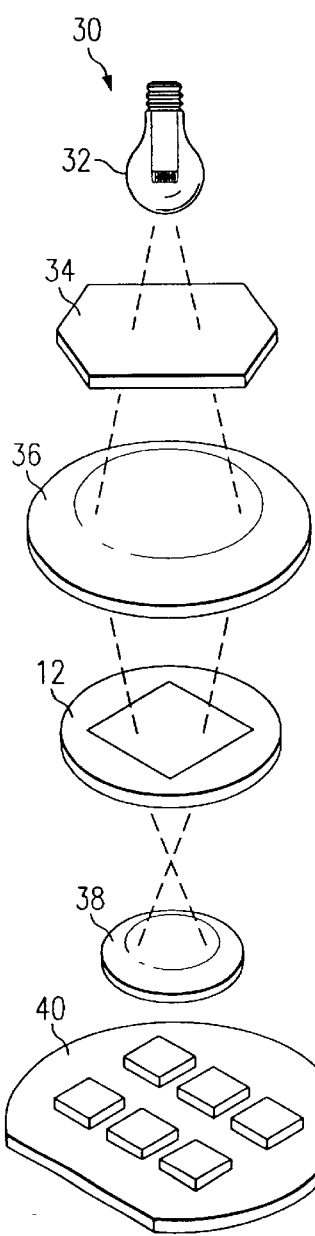
FIG. 3 illustrates a lithography system that images a pattern from a photomask onto a semiconductor wafer according to the teachings of the present invention.

FIG. 3 illustrates a lithography system that images a pattern created by patterned layer 18 and clear areas 20 on photomask 12 on to the surface of wafer 40. Lithography system 30 includes light source 32, filter 34, condenser lens 36 and reduction lens 38. In one embodiment, light source 32 may be a mercury vapor lamp that emits wavelengths between approximately 350 nm and 450 nm. In another embodiment, light source 32 may be an Argon-Ion laser that emits a wavelength of approximately 364 nm. In other embodiments, light source 32 may emit wavelengths between approximately 150 nm and approximately 350 nm. Filter 34 selects the wavelength to be used in lithography system 30 and condenser lens 36 and reduction lens 38 use refractive optics to focus the radiant energy from light source 32 respectively onto photomask 12 and wafer 40.

During a lithography process, electromagnetic energy illuminates photomask 12 and an image of the pattern on photomask 12 is projected onto wafer 40. The pattern on photomask 12 is reduced by reduction lens 38 such that the image is only projected on a portion of wafer 40. Lithography system 30 then realigns wafer 40 so that the pattern from photomask 12 may be imaged onto another portion of wafer 40. The process is repeated until all or most of the surface of wafer 40 is covered by multiple instances of the pattern from photomask 12. The pattern on photomask 12 may be one instance of die 26 or multiple instances of die 26, as illustrated in FIG. 2.

As described above, the transmittance associated with photomask 12 may also be used to adjust an etch process for a semiconductor wafer since the exposed area on the surface of the wafer is directly related to the transmittance of photomask 12. In one embodiment, the mask pattern file used to generate photomask 12 may be altered before photomask 12 is fabricated. For example, a computing platform, including, but not limited to a personal computer (PC), a work station or a server may be used to analyze the patterns contained in the mask pattern file. As described in more detail below, if the transmittance associated with the various patterns in the mask pattern file exceeds a maximum threshold for the etch process selected for the wafer, additional features may be added to the patterns in the mask pattern file to reduce the difference in transmittance between various patterns. The modified mask pattern file may then be used to generate photomask 12.

A semiconductor manufacturer may use photomask 12 to fabricate wafers using the selected etch process without having to manually adjust the etch process. For example, photomask 12 may be placed in lithography system 30 to image a pattern onto a resist layer form on wafer 40. The areas of the resist layer that were exposed to the electromagnetic energy are then developed and etched to expose corresponding regions of a conductive material, such as polysilicon or metal. The conductive material is etched and the remaining resist is removed. If the conductive material is not the last layer to be formed on wafer 40, an insulating layer is formed on the conductive layer and an additional conductive layer and resist layer are formed on the insulating layer. The lithography, developing, etching and depositing steps are repeated until all layers of the semiconductor device have been formed.

If the photomask manufacturer does not or cannot modify the mask pattern file before fabricating photomask 12, the photomask manufacturer may calculate the transmittance associated with photomask 12 after it has been fabricated. As described above, the transmittance of photomask 12 is the total clear area, represented by clear areas 20, divided by the total field area located under pellicle 14. The semiconductor manufacturer may then use the transmittance calculated for photomask 12 to calculate the endpoint for the etch process of a wafer generated by using photomask 12. The photomask manufacturer or semiconductor manufacturer may also calculate the transmittance for each photomask corresponding to the individual layers of material used to form an IC on wafer 40.

Figure 4A:
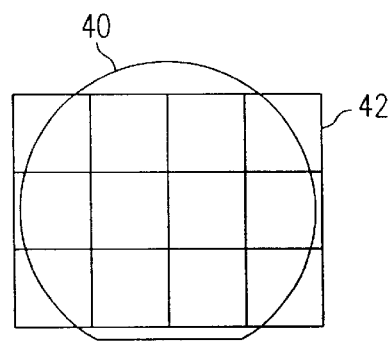
FIGS. 4A and 4B illustrate die mapping rules for a wafer manufactured using a photomask according to the teachings of the present invention.
Figure 4B:
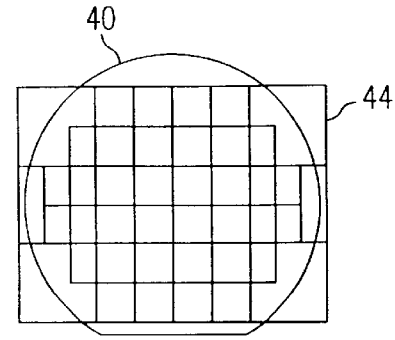

FIGS. 4A and 4B respectively illustrate a saturating die mapping rule and a non-saturating die mapping rule on wafer 40. In one embodiment, an image may be transferred from photomask 12 to wafer 40 by using lithography system 30. As described above, lithography system 30 reduces the pattern on photomask 12 and images the reduced pattern on a portion of the surface of wafer 40. The image is then printed or shot multiple times onto wafer 40 until most or all of the surface includes the pattern. The number of shots needed to cover the surface of wafer 40 is typically a function of the exposure field size, which is dependent on lithography system 30 and on the diameter of wafer 40.

As illustrated in FIG. 4A, saturating map 42 includes stepper shots of die 26 that cover the entire surface of wafer 40. Die 26 are patterned all the way to the wafer edge and incomplete die may be formed at the edge of wafer 40 due to the rounded shape of wafer 40. In the illustrated embodiment, the stepper shot is equal to the dimensions of die 26. Lithography system 30, therefore, individually prints each instance of die 26 on photomask 12 onto wafer 40.

As illustrated in FIG. 4B, non-saturating map 44 includes stepper shots of die 26 that do not fully cover the surface of wafer 40. In this embodiment, die 26 are not patterned to the edges of wafer 40 and the stepper shot of lithography system 30 is approximately one-quarter the size of die 26. Lithography system 30, therefore, requires four printing steps to image one instance of die 26 onto wafer 40.

In both of the embodiments illustrated by FIGS. 4A and 4B, incomplete die are located at the edges of wafer 40. If the number of complete die and incomplete die located on wafer 40 are symmetrical, the wafer exposed area will be approximately equal to the transmittance of photomask 12. In this example, the transmittance of photomask 12 may be used to estimate the area that will be exposed on the surface of wafer 40 and may be used to calculate the endpoint of the etch process for wafer 40.

However, if the number of incomplete die are not symmetrical over the surface of wafer 40, macro-loading effects may occur. Macro-loading effects are global effects that occur due to non-homogeneity in clear areas 20 across the entire surface of wafer 40. The non-homogeneity may be eliminated by either placing additional features in the mask pattern file to compensate for the difference in clear areas 20 over the surface of wafer 40, or centering the shot map with respect to the X direction (e.g., parallel to the wafer flat) and the Y direction (e.g., orthogonal to the wafer flat) such that any incomplete dice have counterparts in both the left/right and top/bottom directions.

Figure 5A:
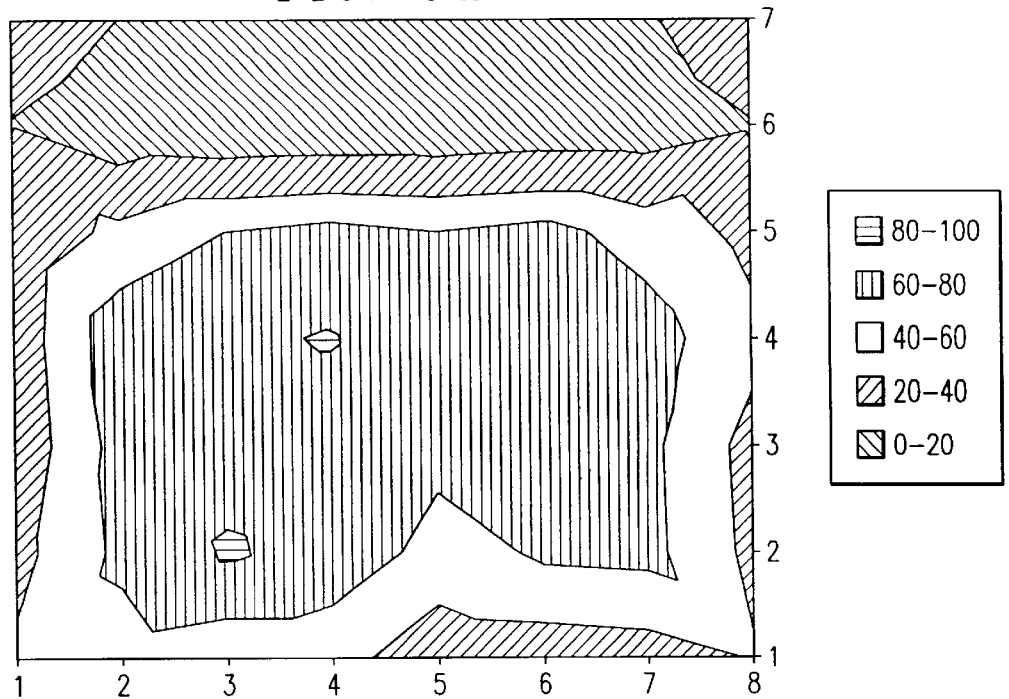
FIG. 5A and 5B illustrate graphs of transmittance variations between cells of a grid dividing a single die on a photomask according to the teachings of the present invention.
Figure 5B:
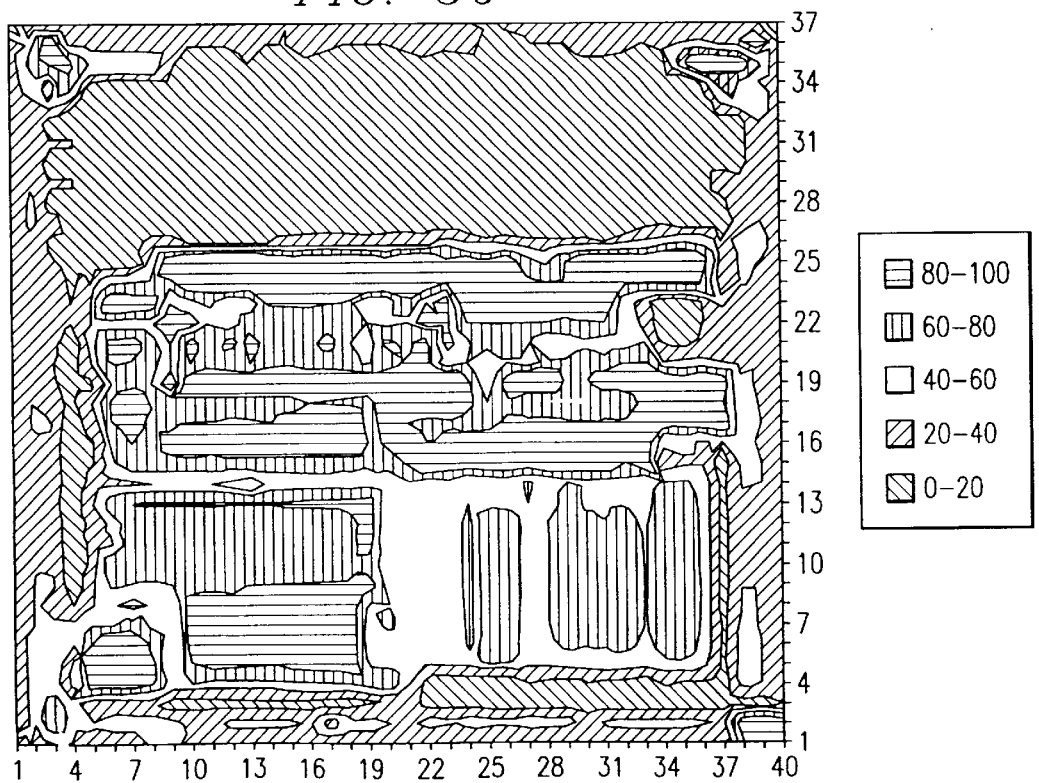

FIGS. 5A and 5B illustrate graphs of transmittance variations between cells of a grid that divides one instance of die 26. Even if the patterns imaged on wafer 40 are symmetrically distributed on wafer 40, which reduces or eliminates macro-loading effects, the patterns in each of die 26 may not be symmetrical and micro-loading effects may be expected. As shown by the equation below, the average clear area fraction on a frame may be calculated by integrating the clear area distribution function inside scribe lines 28 and dividing the result by the area covered by only scribe lines 28. The integral is evaluated by a finite sum extended over all rectangular cells ($\delta x \delta y$) composing the areas in scribe lines 28.

$$a_{cS} = (1/S) \Sigma_S f_C(x,y) \delta x \delta y$$

The size of the rectangular cells may be the smallest divisions allowed by computation limits to best evaluate the average transmittance ratio. The point (x, y) in the center of the rectangle $\delta x \delta y$ and $f_c(x,y)$ is assumed to be constant.

Inside any $\Delta x \Delta y$ rectangle with $\Delta x \Delta y >> \delta x \delta y$, the clear area fraction may be described as:

$$a_{c\Delta x \Delta y} = (1/\Delta x \Delta y) \Sigma_{\Delta x \Delta y} f_c(x,y) \delta x \delta y$$

Note that the rectangle $\Delta x \Delta y$ should be small enough to be "locally" meaningful but also big enough to contain a significant number of features in the pattern on photomask 12 and a reasonably high number of integration cells $\delta x \delta y$ in scribe lines 28. Thus, $\Delta x$ and $\Delta y$ may be greater than or equal to the minimum feature size allowed by the design rules used in a semiconductor manufacturing process.

According to the etch rate calculations described above, any loading effect caused by local differences in the endpoint time (as determined by clear areas 20 located in one instance of die 26) depends on the value of $a_{C \Delta x \Delta y}$. In particular, if $a_{C \Delta x \Delta y}$ is greater than $a_{cS}$ a local under-etch may occur within the patterns in one instance of die 26 since more material should be etched due to the larger than average clear area density. If $a_{C \Delta x \Delta y}$ is less than $a_{cS}$ a local over-etch may occur since less material should be etched within the one instance of die 26 due to the smaller than average clear area density.

As illustrated by FIGS. 5A and 5B, the difference in average clear area densities or average transmittances in local patterns within the instances of die 26 may be evaluated by generating a grid to superimpose over the pattern associated with photomask 12. The clear areas 20 inside any of the cells in the grid may be automatically evaluated using hardware and/or software associated with a fracturing tool. The fracturing tool may include a controller, microprocessor, digital signal processor (DSP) and/or other computing device that may be used to control a scan of the surface of one or more instances of dice 26. The fracturing tool creates variable scalar functions that give the clear area percentage within each cell of the grid.

In the illustrated embodiments, the area of one instance of die 26 may be approximate 4040×5150 microns squared ($\mu m^2$). The grid shown in FIG. 5A includes an array of seven cells by six cells. The individual cells are approximately 505 microns ($\Delta x$) in width and approximately 740 microns ($\Delta y$) in length. The grid shown in FIG. 5B includes an array of thirty-nine cells by thirty-six cells. The individual cells are approximately 101 microns ($\Delta x$) in width and approximately 140 microns ($\Delta y$) in length. Each of the cells in the illustrated grids represents an average transmittance within a twenty percent range. For example, as shown by the legend for FIGS. 5A and 5B, cell [6,6] has a transmittance approximately between zero and twenty percent.

As illustrated, a fine grid more accurately reveals the local transmittance features across the etching surface. The grid illustrated in FIG. 5B, therefore, gives more information than the grid illustrated in FIG. 5A. However, a smaller grid increases the number of cells to be processed and, therefore, increases the processing time. The grid should be small enough to convey useful information about the clear area percentage of the individual cells but large enough not to substantially increase the processing time.

In order to choose a grid size, a maximum threshold for a particular etch process may be determined. In one embodiment, the maximum threshold represents a maximum difference of clear area percentage that may be tolerated by the etch process without creating micro-loading effects between two different cells within die 26. The value for the maximum threshold may be dependent on the photomask level and the layout of the patterns for the particular photomask level.

Once the maximum threshold is determined, a relatively large grid (e.g., the grid illustrated in FIG. 5A) may be selected. The grid size, however, may be dependent on the maximum threshold. For example, if the particular etch process is sensitive to very small variations in transmittance between the exposed areas, the initial grid should be small (e.g., the grid illustrated in FIG. 5B). The grid shown in FIG. 5A may be acceptable if a large difference in clear area percentage is experimentally found to be tolerated by the etch process. For example, if the selected etch process can tolerate a transmittance difference of less than approximately sixty percent between adjacent cells, the larger grid size may be acceptance since cell [5,5] and cell [5,6] have a transmittance difference of greater than sixty percent. However, if the selected etch process may only tolerate a forty percent difference, the larger grid size would not be acceptable.

Once the initial grid size is selected, the clear area percentage may be calculated for all of the cells. If there are at least two adjacent cells with clear area percentages that have a difference greater than the maximum threshold, the grid size may be used for the etch process. If there are no cells that show a difference in clear area percentage greater than the maximum threshold, the grid size should be decreased until at least two cells exceed the threshold.

When the grid size that potentially shows micro-loading effects within die 26 is determined, a micro-loading distance may be defined. The micro-loading distance represents the distance between the centers of two adjacent cells that show a clear area percentage difference greater than the maximum threshold. If the clear area percentage difference for more than two cells exceeds the maximum threshold, the micro-loading distance may be defined as the minimum distance among all of the possible cell pairs. If the micro-loading distance is very small, the patterns in die 26 are very sensitive to micro-loading effects. Conversely, if the micro-loading distance is relatively large, the patterns in die 26 are not sensitive to micro-loading effects.

In order to correct micro-loading effects in the mask patter file, tiling techniques during layout preparation may be used. For example, one tiling technique uses additional features in the mask pattern file, which do not interference with the functionality of the ICs. The additional features may simultaneously reduce clear area distribution variations and reduce micro-loading effects during an etch process. A photomask manufacturer may generate a map of the micro-loading distance to show where the various tiling features are needed to reduce or eliminate the micro-loading effects within one instance of die 26. The map may then be used by either the photomask manufacturer or the semiconductor manufacturer to modify the patterns in the mask pattern file.

Figure 6:
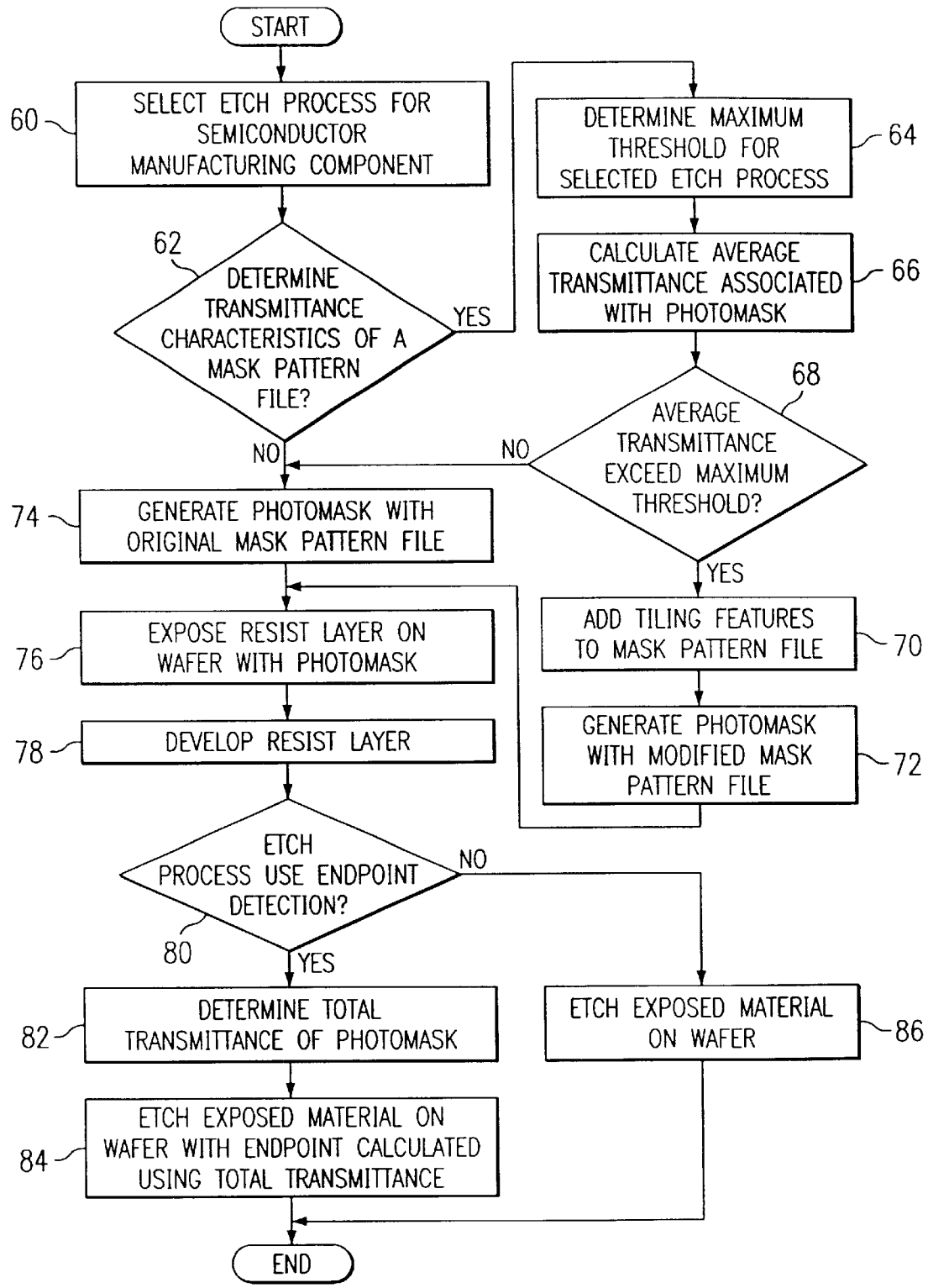
FIG. 6 illustrates a flow chart of a method for reducing loading effects on a semiconductor manufacturing component during an etch process.

FIG. 6 illustrates a flow chart of a method for reducing loading effects on a semiconductor manufacturing component during an etch process. In general, an average transmittance associated with a photomask may be calculated and compared to a maximum threshold for a selected etch process. If the average transmittance exceeds the maximum threshold, additional features are added to a mask pattern file used to generate the photomask and loading effects during the selected etch process are reduced. If the selected etch process uses an endpoint detection mechanism, the total transmittance associated with the photomask is used to calculate the endpoint of the selected etch process. Although the adjustment to a selected etch process is described below with respect to a semiconductor wafer, the etch process may also be used with a photomask blank to create photomask 12.

At step 60, an etch process is selected for a semiconductor manufacturing component, such as a semiconductor wafer. In one embodiment, the etch process may be a dry etch process, such as a plasma etch process. At step 62, a photomask manufacturer may determine the transmittance characteristics of a mask pattern file generated from a circuit design file. If the photomask manufacturer characterizes the transmittance of the patterns in the mask pattern file, a maximum threshold for the selected etch process is determined at step 64. In one embodiment, the pattern in the mask pattern file used to fabricate photomask 12 may be divided into a grid (e.g., the grids illustrated in FIGS. 5A and 5B). Each cell in the grid may have a particular transmittance associated with each of the cells. As described above, the maximum threshold represents the maximum acceptable difference in transmittance between two adjacent cells that may be tolerated by the etch process and not introduce loading effects during the etch process on wafer 40.

Once the maximum threshold is determined for the selected etch process, the average transmittance associated with photomask 12 is calculated at step 66. In one embodiment, the average transmittance is calculated by dividing the pattern in a mask pattern file used to fabricate photomask 12 into a grid. The clear area percentage for each cell is determine and the difference between each adjacent cell is then calculated to determine the average transmittance associated with each cell pair. At step 68, the average transmittances for each cell pair associated are compared to the maximum threshold for the selected etch process. If at least one of the average transmittances exceeds the maximum threshold, tiling features are added to the mask pattern file to create a modified mask pattern file at step 70. The tiling features may reduce the variations between clear area percentage in the individual cells of the grid and therefore, reduce the micro-loading effects that occur in the individual patterns. At step 72, photomask 12 is generated with the modified pattern file and may be used by a semiconductor manufacturer to create patterns on wafer 40. If the semiconductor manufacturer uses the selected etch process to each wafer 40, no micro-loading effects will occur during the etch process since the patterns from photomask 12 were modified to reduce loading effects during the selected etch process.

If the photomask manufacturer does not determine the transmittance characteristics of the mask pattern file or if the average transmittance does not exceed the maximum threshold for the selected etch process, photomask 12 may be fabricated with the original mask pattern file at step 74. Once photomask 12 is created, either with the original mask pattern file or the modified mask pattern file, photomask 12 is used by a semiconductor manufacturer in a lithography tool, such as lithography system 30, to image the pattern on photomask 12 on to the surface of wafer 40 at step 76. Typically, the pattern is printed in a resist layer formed on wafer 40 and the resist layer is developed and etched to remove the resist layer in the exposed areas at step 78.

At step 80, the semiconductor manufacturer may use an etch process that includes an endpoint detection mechanism. In one embodiment, a substantially similar etch process may be used for a photoresist layer and a conductive layer, such as polysilicon or metal. If the etch process uses endpoint detection, the total transmittance associated with photomask is calculated by either the photomask manufacturer or the semiconductor manufacturer at step 82. In one embodiment, the total transmittance is calculated by summing the areas in the mask pattern file that correspond to clear areas 20 on photomask 12 and dividing the sum by the total field area of the mask pattern file. In another embodiment, the total transmittance is calculated by summing clear areas 20 on photomask 12 and dividing the sum by the total field area located under pellicle 14. The total transmittance is then used to calculate the endpoint of the etch process and the calculated endpoint is used by an each reactor to determine when the etch process should be stopped at step 84. If the selected etch process does not use endpoint detection, the exposed areas of wafer 40 are etched to form the pattern from photomask 12 on wafer 40 at step 86.

Although the present invention has been described in detail, it should be understood that various changes, substitutions, and alterations can be made without departing from the spirit and scope of the invention as defined by the appended claims.

What is claimed is:

1. A method for reducing loading effects on a photomask blank during an etch process, comprising:
   calculating a transmittance associated with a mask pattern file operable to be used by a photolithography system to generate a photomask; and
   adjusting an etch process for a material formed on a photomask blank based on the transmittance calculated for the mask pattern file.

2. The method of claim 1, wherein calculating the transmittance associated with the mask pattern file comprises:
   determining a clear area percentage for the mask pattern file; and
   dividing the clear area percentage by a total field exposure area for the mask pattern file.

3. The method of claim 1, wherein adjusting the etch process for the material formed on the photomask blank comprises calculating an endpoint for the etch process using the transmittance calculated for the mask pattern file.

4. The method of claim 1, wherein calculating the transmittance associated with the mask pattern file comprises:
   determining a first clear area percentage for a first cell in the mask pattern file;
   determining a second clear area percentage for a second cell in the mask pattern file; and
   calculating a transmittance difference between the first and second clear area percentages.

5. The method of claim 4, wherein adjusting the etch process for the material formed on the photomask blank comprises:
   determining a maximum threshold for the etch process;
   comparing the transmittance difference between the first and second clear area percentages to the maximum threshold for the etch process; and
   adding a feature to the mask pattern file if the transmittance difference is greater than the maximum threshold.

6. The method of claim 5, wherein determining the maximum threshold for the etch process comprises:

dividing the mask pattern file into a plurality of cells, the cells including a first cell and a second cell; and determining a maximum difference between a first clear area percentage associated with the first cell and a second clear area percentage associated with the second cell.

7. The method of claim 6, further comprising the plurality of cells including dimensions approximately equal to a minimum feature size in the mask pattern file.

8. The method of claim 1, wherein the etch process comprises a dry etch process.

9. The method of claim 1, wherein the material comprises a conductive material.

10. The method of claim 1, wherein the material comprises a photoresist.

11. A method for reducing loading effects on a photomask blank during an etch process, comprising:

determining a maximum acceptable difference between a first clear area percentage and a second clear area percentage for an etch process;

calculating a transmittance difference between a first transmittance for a first feature associated with a mask pattern file and a second transmittance for a second feature associated with the mask pattern file; and adjusting the etch process for a material formed on a photomask blank if the transmittance difference exceeds the maximum acceptable difference associated with the etch process.

12. The method of claim 11, further comprising the mask pattern file operable to be used by a photolithography system to image a pattern onto a photomask.

13. The method of claim 11, wherein adjusting the etch process for the material formed on the photomask blank comprises:

adding a feature to the mask pattern file to create a modified mask file; and manufacturing a modified photomask with the modified mask file.

14. The method of claim 11, wherein the first and second features comprise die.

15. The method of claim 11, wherein the first and second features comprise individual patterns located in a die.

16. The method of claim 11, wherein the material comprises a conductive material.

17. The method of claim 11, wherein the material comprises a photoresist.

18. A method for manufacturing a photomask, comprising:

calculating a transmittance associated with a mask pattern file;

imaging a pattern from the mask pattern file into a resist layer formed on an opaque layer of a photomask blank, the opaque layer formed on a transparent substrate;

developing the resist layer to expose portions of the opaque layer;

adjusting an etch process for the photomask blank based on the transmittance calculated for the mask pattern file; and etching the opaque layer with the adjusted etch process to expose portions of the transparent substrate.

19. The method of claim 18, wherein calculating the transmittance associated with the mask pattern file comprises:

determining a clear area percentage for the mask pattern file; and dividing the clear area percentage by a total field exposure area for the mask pattern file.

20. The method of claim 18, wherein adjusting the etch process for the photomask blank comprises calculating an endpoint for the etch process using the transmittance calculated for the mask pattern file.

21. The method of claim 18, wherein calculating the transmittance associated with the mask pattern file comprises:

determining a first clear area percentage for a first cell in the mask pattern file;

determining a second clear area percentage for a second cell in the mask pattern file; and calculating a transmittance difference between the first and second clear area percentages.

22. The method of claim 21, wherein adjusting the etch process for the photomask blank comprises:

determining a maximum threshold for the etch process;

comparing the transmittance difference between the first and second clear area percentages to the maximum threshold for the etch process; and adding a feature to the mask pattern file if the transmittance difference is greater than the maximum threshold.

* * * * *